(12) United States Patent
Park

(10) Patent No.: US 6,928,006 B2
(45) Date of Patent: Aug. 9, 2005

(54) SEMICONDUCTOR MEMORY DEVICE CAPABLE OF REDUCING NOISE DURING OPERATION THEREOF

(75) Inventor: Kee-Teok Park, Ichon-shi (KR)

(73) Assignee: Hynix Semiconductor Inc. (KR)

(*) Notice: Subject to any disclaimer, the term of this patent is extended or adjusted under 35 U.S.C. 154(b) by 0 days.

(21) Appl. No.: 10/746,640

(22) Filed: Dec. 23, 2003

(65) Prior Publication Data

US 2004/0218427 A1 Nov. 4, 2004

(30) Foreign Application Priority Data

Apr. 30, 2003 (KR) .................. 10-2003-0027758

(51) Int. Cl.⁷ ................................. G11C 7/00
(52) U.S. Cl. ..................... 365/189.11; 365/230.03
(58) Field of Search .................. 365/189.11, 230.03, 365/194, 185.24

(56) References Cited

U.S. PATENT DOCUMENTS

| | | | |
|---|---|---|---|
| 5,999,472 A | | 12/1999 | Sakurai |
| 6,108,252 A | | 8/2000 | Park |
| 6,215,719 B1 | | 4/2001 | Anraku |
| 6,333,888 B1 | * | 12/2001 | Nakazawa ............ 365/230.03 |
| 6,370,077 B1 | | 4/2002 | Koyanagi et al. |
| 6,418,070 B1 | | 7/2002 | Harrington et al. |
| 6,483,760 B2 | | 11/2002 | Kang |
| 6,496,442 B2 | | 12/2002 | Koyanagi et al. |
| 6,597,201 B1 | | 7/2003 | Parris et al. |
| 6,683,809 B2 | * | 1/2004 | Matsuda et al. ...... 365/185.18 |
| 2002/0008509 A1 | | 1/2002 | Kang |
| 2002/0114209 A1 | | 8/2002 | Koyanagi et al. |
| 2003/0035325 A1 | | 2/2003 | Kim et al. |
| 2003/0043682 A1 | | 3/2003 | Usuki et al. |

FOREIGN PATENT DOCUMENTS

| | | |
|---|---|---|
| JP | 10-162575 | 6/1998 |
| JP | 11-066843 | 3/1999 |
| JP | 11-096752 | 4/1999 |
| JP | 2000-011656 | 1/2000 |
| JP | 2000-132968 | 5/2000 |
| JP | 2000-187977 | 7/2000 |
| JP | 2000-251469 | 9/2000 |
| JP | 2002-074952 | 3/2002 |
| JP | 2003-085977 | 3/2003 |

* cited by examiner

*Primary Examiner*—Thong Q. Le
(74) *Attorney, Agent, or Firm*—Blakely Sokoloff Taylor & Zafman

(57) ABSTRACT

Disclosed is a semiconductor memory device which is capable of reducing noise during an operation thereof by individually supplying clamping voltages to respective banks. The semiconductor memory device includes: a plurality of banks; a plurality of clamping voltage supply units corresponding to the plurality of banks, for supplying clamping voltages to the corresponding banks, in which the clamping voltages are obtained by clamping an external power supply voltage to a predetermined level; and a clamping voltage control units for controlling the plurality of clamping voltage supply units to allow the corresponding clamping voltages to be supplied to selected banks while the selected banks are activated.

5 Claims, 7 Drawing Sheets

US 6,928,006 B2

SEMICONDUCTOR MEMORY DEVICE CAPABLE OF REDUCING NOISE DURING OPERATION THEREOF

FIELD OF THE INVENTION

The present invention relates to a semiconductor memory device, and more particularly, to a memory device which is capable of reducing noise during an operation thereof.

DESCRIPTION OF THE PRIOR ART

With higher integration and lower power consumption, a memory device uses a lower driving voltage, and therefore several techniques for an operation of the memory device have been proposed. One of them is an overdriving of a sense amplifier.

When a sense amplifier senses and amplifies data in order to process data, an operating voltage is lowered. Therefore, there occurs a problem that increases a time when a bit line is enabled from a precharge voltage level and pulled up to a bit line driving voltage level.

In order to solve the problem, an overdriving method is proposed which supplies an external power supply voltage (VDD) of a high level in order to increase a data sensing speed of the sense amplifier when the sense amplifier is activated and then supplies a core voltage (Vcore) smaller than the power supply voltage (VDD) after a predetermined time.

FIG. 1 is a block diagram of a conventional memory device.

Referring to FIG. 1, the conventional memory device includes four banks 10 to 13 and a clamping voltage supply unit 20. The clamping voltage supply unit 20 receives and clamps a power supply voltage VDD to a predetermined level, and then supplies the clamping voltage VDD_CLP to the respective banks 10 to 13.

The clamping voltage supply unit 20 is provided with a MOS transistor MN0 having a gate receiving a clamping control signal VPP, one terminal receiving the power supply voltage VDD, and the other terminal connected to the banks to supply the clamping voltage VDD_CLP thereto. Here, the clamping voltage VDD_CLP is a voltage given by subtracting a threshold voltage (Vt) from the clamping control signal VPP.

FIG. 2 is a circuit diagram of a bit line sense amplifier using the clamping voltage VDD_CLP within the bank of FIG. 1.

Referring to FIG. 2, the bit line sense amplifier 10b senses and amplifies a difference between voltage levels applied to bit lines BL and /BL, and a bit line driving voltage supply unit 10a_1 supplies a driving voltage VDD_CLP or Vcore to the bit line sense amplifier 10b. A bit line ground voltage supply unit 10a_2 supplies a ground voltage to the bit line sense amplifier 10b.

Hereinafter, an operation of the conventional memory device will be described with reference to FIGS. 1 and 2.

A general memory device includes a plurality of banks, each of which can access data independently. A process of reading data within one bank is carried out by inputting an address corresponding to a read command and selecting one unit cell corresponding to the inputted address. Data stored in the selected unit cell is applied to the bit lines BL and /BL. The data applied to the bit lines is then sensed and amplified by the bit line sense amplifier and applied to I/O data lines. The data applied to the I/O data lines is again amplified by an I/O sense amplifier and outputted to an exterior.

Generally, a signal magnitude of the data stored in one unit cell is so very slight that the bit lines cannot be pulled up or pulled down sufficiently. For this reason, the data stored in the unit cell is amplified by the bit line sense amplifier 10b.

As shown in FIG. 2, the bit line sense amplifier 10b includes two PMOS transistors MP2 and MP3 and two NMOS transistors MN7 and MN8 for sensing and amplifying voltages applied to the bit lines BL and /BL, and a PMOS transistor MP1 and an NMOS transistor MN9 for supplying the voltages VDD_CLP and Vcore that are used to operate the bit line sense amplifier 10b, respectively.

In order for the bit line sense amplifier 10b to amplify the data applied to the bit lines BL and /BL, a first sense amplifier enable signal SAn is inputted to turn on an NMOS transistor MN6, so that the ground voltage is supplied to the bit line sense amplifier 10b.

Next, a second sense amplifier enable signal SAp2 is inputted during a predetermined time to turn on an NMOS transistor MN4 of the driving voltage supply unit 10a_1, so that the clamping voltage VDD_CLP is supplied to the bit line sense amplifier 10b. Then, a third sense amplifier enable signal SAp2 is inputted to turn on an NMOS transistor MN5 of the driving voltage supply unit 10a_1, so that the core voltage Vcore is supplied to the bit line sense amplifier 10b.

Here, the core voltage Vcore is a voltage used to drive an internal circuit of the semiconductor memory device, and the clamping voltage VDD_CLP is a voltage having a level higher than the core voltage Vcore and being temporarily supplied at a time when the bit line sense amplifier 10b is enabled in order to increase a driving speed of the bit line sense amplifier 10b.

At this time, the clamping voltage VDD_CLP is used for the purpose of supplying the bit line sense amplifier 10b with the clamping voltage that maintains a constant level (VPP−Vt) even if a level of the power supply voltage VDD supplied from an external circuit is increased.

However, in the above-described structure that supplies the clamping voltage VDD_CLP to all banks at the same time, the clamping voltage VDD_CLP is inputted to banks that are not driven, thereby generating noise.

In addition, since the MOS transistor MN0 of the clamping voltage supply unit 20 is designed to allow all of the four banks to be loaded, the noise generated due to the supply of the clamping voltage to the banks that are not driven becomes greatly increasing. Further, even the banks that are driven may generate noise because the clamping voltage VDD_CLP supplied to the sense amplifier driving voltage supply unit 10a_1 flows into a supply terminal that supplies the core voltage Vcore.

SUMMARY OF THE INVENTION

It is, therefore, a primary object of the present invention to provide a memory device which is capable of reducing noise during an operation thereof by supplying individually clamping voltages to respective banks.

In accordance with a preferred embodiment of the present invention, there is provided a semiconductor memory device which comprises: a plurality of banks; a plurality of clamping voltage supply means corresponding to the plurality of banks, for supplying clamping voltages to the corresponding banks, the clamping voltages being obtained by clamping an external power supply voltage to a predetermined level; and a clamping voltage control means for controlling the plurality of clamping voltage supply means to allow the corresponding clamping voltages to be supplied to selected banks while the selected banks are activated.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

The preferred embodiments will be described below in detail with reference to accompanying drawings.

Figure 3:
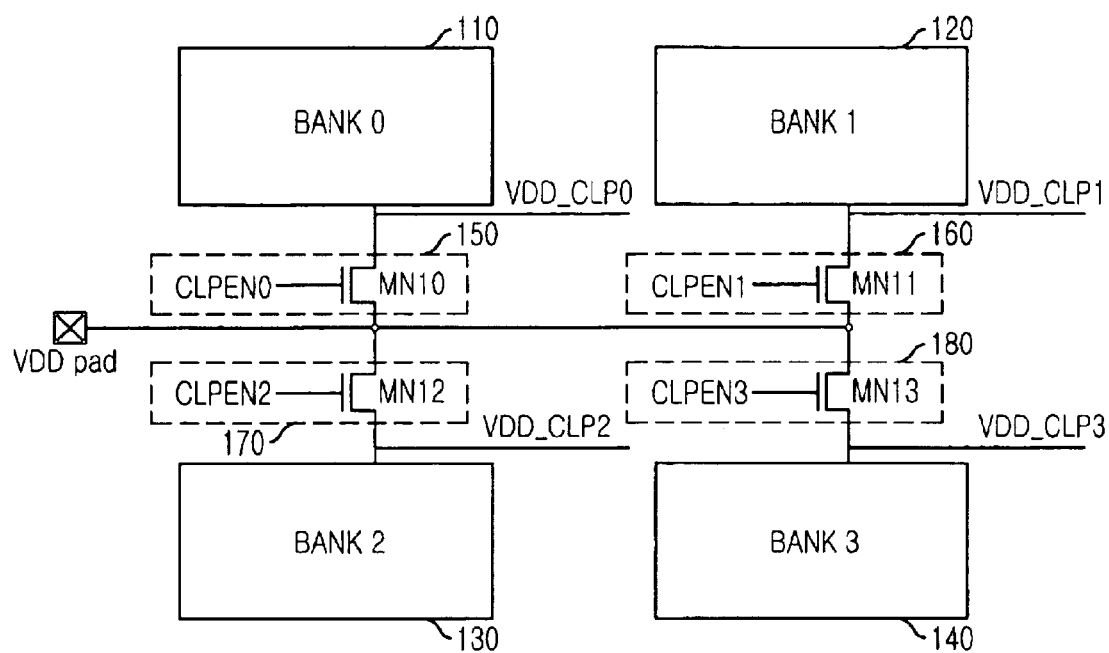
FIG. 3 is a block diagram of a memory device in accordance with an embodiment of the present invention.
Figure 3:
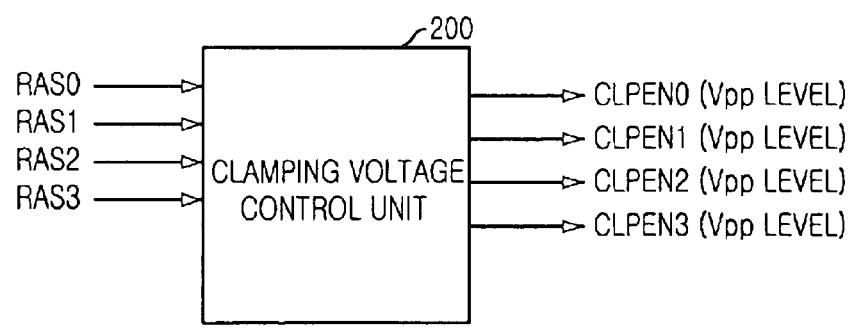

FIG. 3 is a block diagram of a memory device in accordance with a preferred embodiment of the present invention.

Referring to FIG. 3, the memory device according to the present invention includes: a plurality of banks 110 to 140; a plurality of clamping voltage supply units 150 to 180 corresponding to the plurality of banks 110 to 140, for supplying the corresponding banks with clamping voltages VDD_CLP0 to VDD_CLP3 which are obtained by clamping an external power supply voltage VDD to a predetermined level; and a clamping voltage control unit 200 for controlling the plurality of clamping voltage supply units 150 to 180 to allow the clamping voltages VDD_CLP0 to VDD_CLP3 to be supplied to the corresponding banks 110 to 140 selected while the banks 110 to 140 are activated.

Further, the clamping voltage supply unit, for example, 150 is provided with a MOS transistor MN10 which has one terminal receiving the power supply voltage VDD, a gate receiving the clamping control voltage CLPEN0 from the clamping voltage control unit 200, and the other terminal supplying the corresponding bank 110 with the clamping voltage VDD_CLP0 obtained by subtracting a threshold voltage (Vt) from the clamping control signal CLPEN0. The remaining clamping voltage supply units 160 to 180 are provided with the same structure as the clamping voltage supply unit 150. In other words, the claming voltage supply units 160, 170 and 180 are provided with MOS transistors MN11, MN12 and MN13, which supply the clamping voltages VDD_CLP1, VDD_CLP2 and VDD_CLP3 to the corresponding banks 120, 130 and 140, respectively.

Figure 4:
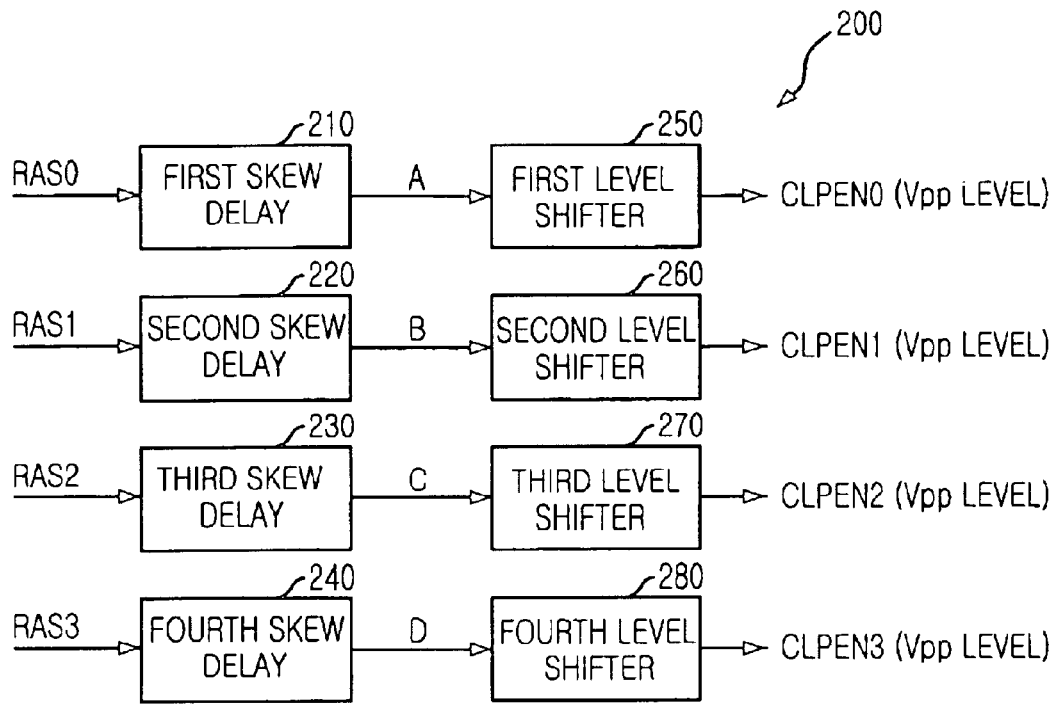
FIG. 4 is a block diagram of a clamping voltage control unit shown in FIG. 3.

FIG. 4 is a block diagram of the clamping voltage control unit shown in FIG. 3.

Referring to FIG. 4, the clamping voltage control unit 200 includes a plurality of skew delay units 210 to 240 and a plurality of level shifters 250 to 280. The plurality of skew delay units 210 to 240 respectively receive and delay a plurality of bank enable signals RAS0 to RAS3, which are enabled during a period at which the plurality of banks 110 to 140 are activated, for a predetermined time and then output the delayed bank enable signals. The plurality of level shifters 250 to 280 correspond to the plurality of skew delay units 210 to 240. The plurality of level shifters 250 and 280 shift the level of the power supply voltage VDD to the clamping control signals CLPEN0 to CLPEN3 (VPP level), and supply the clamping control signals CLPEN0 to CLPEN3 to the plurality of clamping voltage supply units 150 to 180. Additionally, the plurality of level shifters 250 to 280 receive outputs of the skew delay units 210 to 240 to interrupt the clamping control signals CLPEN0 to CLPEN3.

Figure 5:
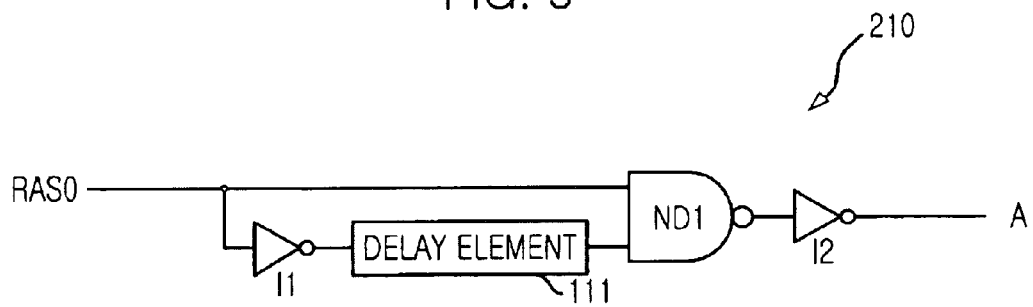
FIG. 5 is a circuit diagram of a skew delay unit shown in FIG. 4.

FIG. 5 is a circuit diagram of the first skew delay unit 210 shown in FIG. 4.

Referring to FIG. 5, the first skew delay unit 210 includes: a first inverter I1 for inverting the first bank enable signal RAS0; a delay element 111 for delaying an output of the first inverter I1 for a predetermined time; a NAND gate ND1 receiving the first bank enable signal RAS0 and an output of the delay element 111; and a second inverter I2 for inverting an output of the NAND gate ND1 to output the inverted signal to the corresponding level shift 250. In the same manner, the remaining skew delay units 220 to 240 are also provided.

Figure 6:
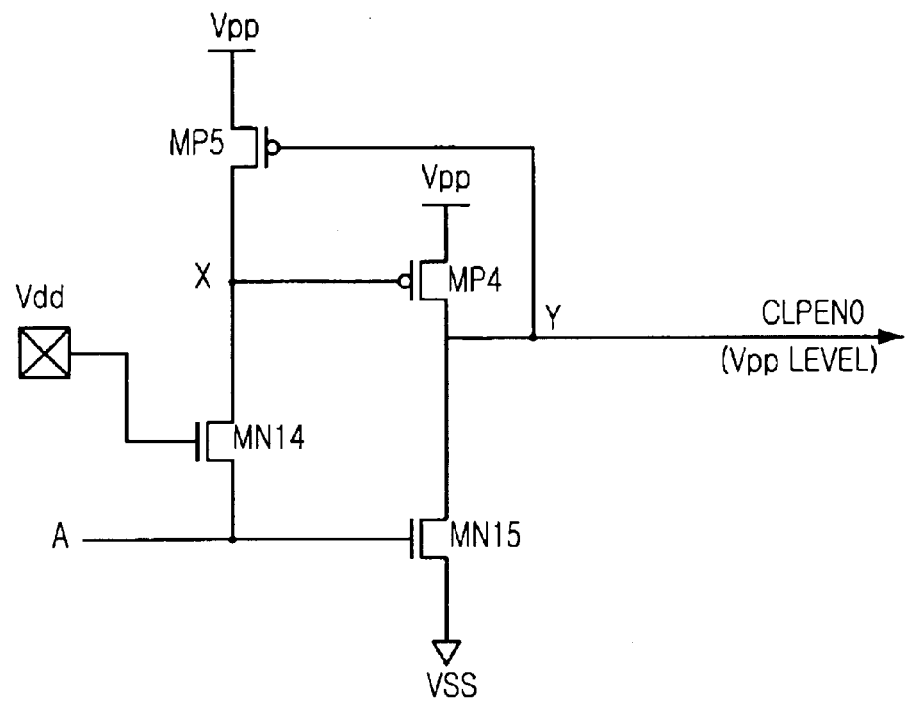
FIG. 6 is a circuit diagram of a level shifter shown in FIG. 4

FIG. 6 is a circuit diagram of the first level shifter 250 shown in FIG. 4.

Referring to FIG. 6, the first level shifter 250 includes: a first MOS-transistor MP5 having one terminal connected to a voltage supply terminal VPP having a level of the clamping control signal CLPEN0, the other terminal connected to a first node X, and a gate connected to a second node Y; a second MOS transistor MP4 having one terminal connected to the voltage supply terminal VPP having the level of the clamping control signal CLPEN0, the other terminal connected to the second node Y, and a gate connected to the first node X; a third MOS transistor MN14 having a gate receiving the power supply voltage VDD, one terminal connected to the first node X, and the other terminal connected to an output terminal of the corresponding skew delay unit 210 among the plurality of skew delay units 210 and 240; and a fourth MOS transistor MN15 having a gate connected to the output terminal of the first skew delay unit 210, one terminal connected to the second node Y, and the other terminal connected to the ground voltage VSS. Here, the clamping control signal CLPEN0 is outputted through the second node Y. In the same manner, the remaining level shifters 260 to 280 are also provided.

Figure 7:
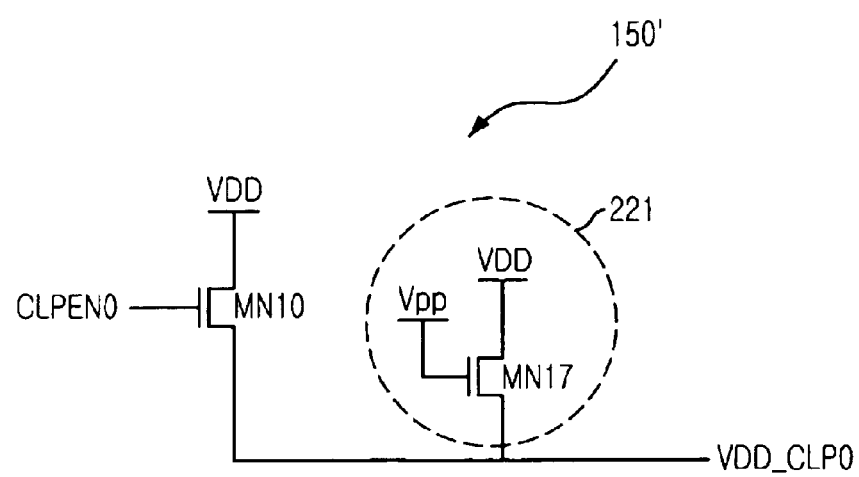
FIG. 7 is a circuit diagram illustrating a clamping voltage supply unit of FIG. 3 in accordance with another embodiment of the present invention.

FIG. 7 is a circuit diagram illustrating the clamping voltage supply unit of FIG. 3 in accordance with another embodiment of the present invention.

Referring to FIG. 7, the clamping voltage supply unit 150 includes a MOS transistor MN10 for supplying the clamping voltage VDD_CLP0 in response to the clamping control signal CLPEN0, and a MOS transistor MN17, whose driving capability is smaller than the MOS transistor MN10, which has a gate receiving a voltage having the same level as the clamping control signal CLPEN0 and outputs the clamping voltage VDD_CLP0 to the first bank 110. The MOS transistor MN17 is provided in order to supply more rapidly the clamping voltage VDD_CLP0 to the bank. A size of the MOS transistor MN10 should be small so that noise cannot occur in a circuitry of the bank to which the clamping voltage VDD_CLP0 is supplied.

Figure 8:
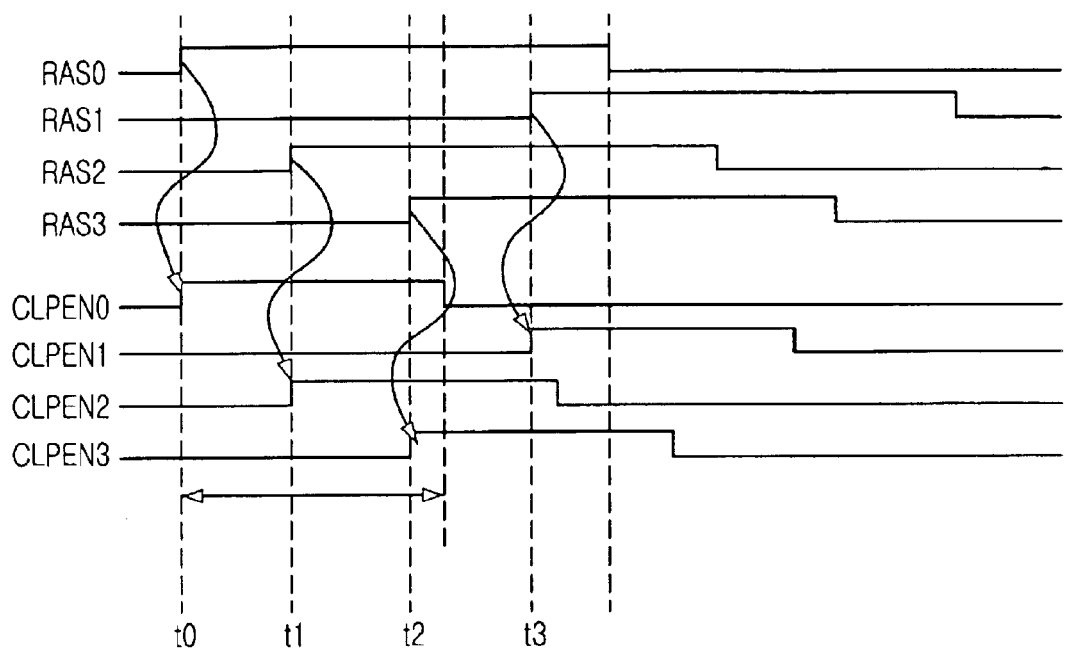
FIG. 8 is a waveform illustrating an operation of a memory device shown in FIG. 4.

FIG. 8 is a waveform illustrating an operation of the memory device shown in FIG. 4. An operation of the memory device according to the present invention will be described below with reference to FIGS. 3 to 8.

In the memory device according to the present invention, the clamping voltages VDD_CLP0 to VDD_CLP3 used in the banks are individually supplied from the clamping voltage supply units 150 to 180 corresponding to the banks, not one clamping voltage supply unit. The clamping voltage supply units 150 to 180 are controlled by the clamping control signals CLPEN0 to CLPEN3 outputted from the clamping voltage control unit 200.

The clamping voltage control unit 200 receives the bank enable signals (i.e., the RAS signals RAS0 to RAS3) used to maintain the banks, which operate during a period at which row address is inputted, at an enable state. Then, the clamping voltage control unit 200 outputs the clamping control signals CLPEN0 to CLPEN3 to the clamping voltage supply units 150 to 180 according to the inputted RAS signals of the banks. Here, the RAS signals RAS0 to RAS3 are control signals used to allow the clamping voltage supply units 150 to 180 to supply the clamping voltages VDD_CLP0 to VDD_CLP3 during a period when the clamping voltages VDD_CLP0 to VDD_CLP3 are used in the banks 110 to 150.

In the respective skew delay units 210 to 240 of the clamping voltage control unit 200, the delay element 111 delay the inputted RAS signals RAS0 to RAS3 and outputs the delayed RAS signals to the corresponding level shifters 250 to 280.

The level shifters 250 to 280 output the clamping control signals CLPEN0 to CLPEN3 to the corresponding clamping voltage supply units, in which the clamping control signals CLPEN0 to CLPEN3 are signals obtained by shifting the outputs of the skew delay units 210 to 240 as much as the voltage level VPP, which is outputted to the respective banks 110 to 140 and used as a standard for the clamping operation.

The respective clamping voltage supply units 150 to 180 supply the respective banks with the clamping voltages VDD_CLP0 to VDD_CLP3 obtained by subtracting the threshold voltage (Vt) from the clamping control signals CLPEN0 to CLPEN3 of the voltage level VPP, which are used as a standard for the clamping operation. Here, while the clamping control signals CLPEN0 to CLPEN3 have the same voltage levels, the enabling periods are different from each other according to the RAS signals RAS0 to RAS3. Accordingly, the clamping voltages VDD_CLP0 to VDD_CLP3 have the same voltage levels, i.e., (VPP−Vt).

Referring to FIG. 8, the RAS signals RAS0 to RAS3 are delayed for a predetermined time and the clamping control signals CLPEN0 to CLPEN3 are outputted to the clamping voltage supply units 150 to 180 corresponding to the banks 110 to 140. The delay time "d" represents a time delayed by the delay element 111 of the skew delay unit shown in FIG. 5.

Figure 1:
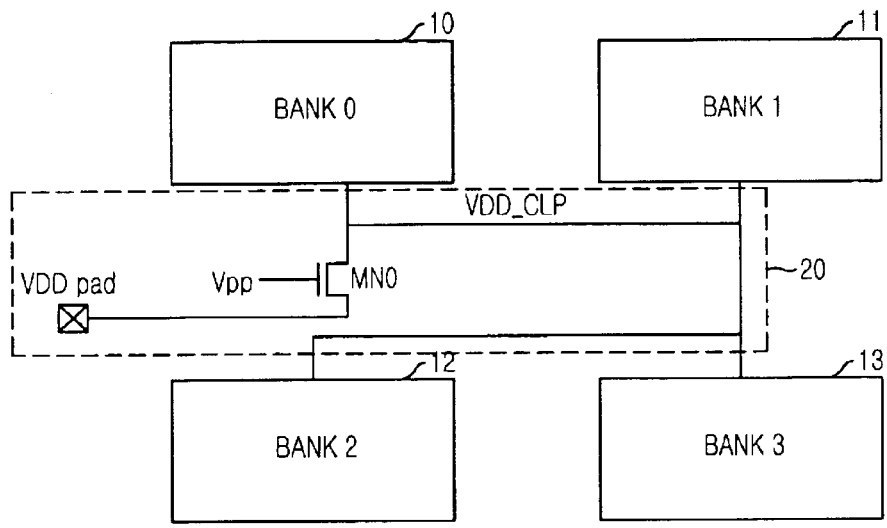
FIG. 1 is a block diagram of a conventional memory device.
Figure 2:
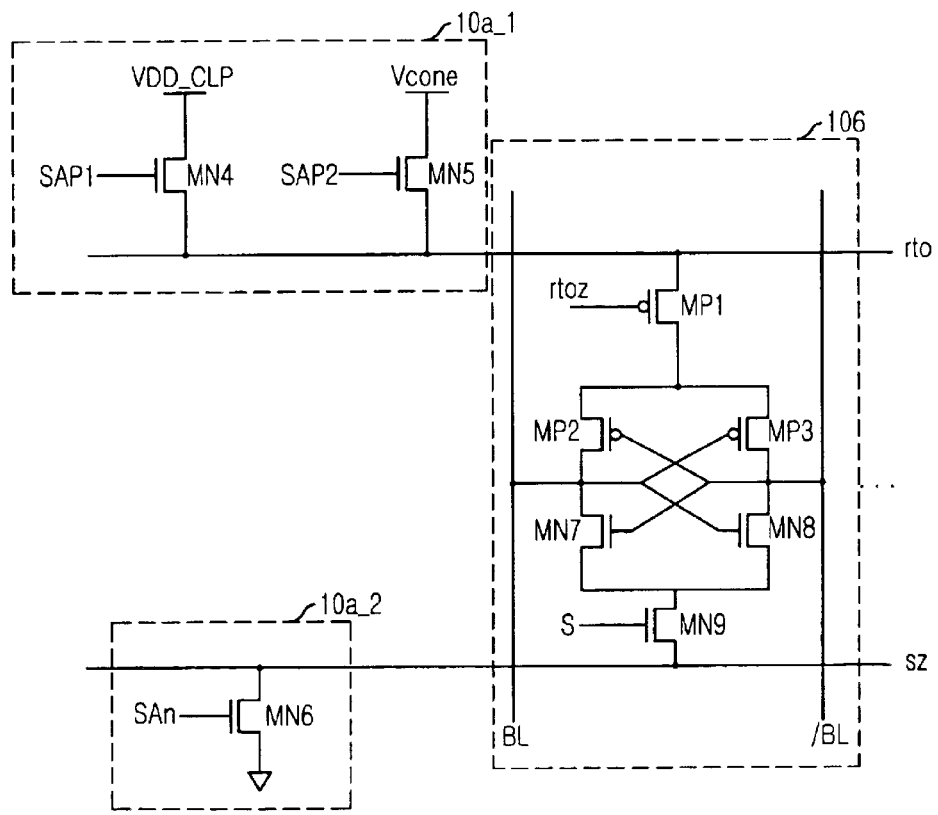
FIG. 2 is a circuit diagram showing an internal structure of a bank of FIG. 1.

Here, the respective banks determine the delay time of the delay element 11 according to periods when they require the inputted clamping voltages. For example, in the bit line sense amplifier of FIG. 2, the clamping control signals CLPEN0 to CLPEN3 should be outputted in the enable state to the clamping voltage supply units so as to supply the clamping voltages VDD_CLP0 to VDD_CLP3 to the respective banks during a period when the clamping voltages VDD_CLP0 to VDD_CLP3 are required. According to the embodiment of the present invention, the delay time of the delay element 111 determines the period when the clamping control signals CLPEN0 to CLPEN3 are enabled.

Figure 9:
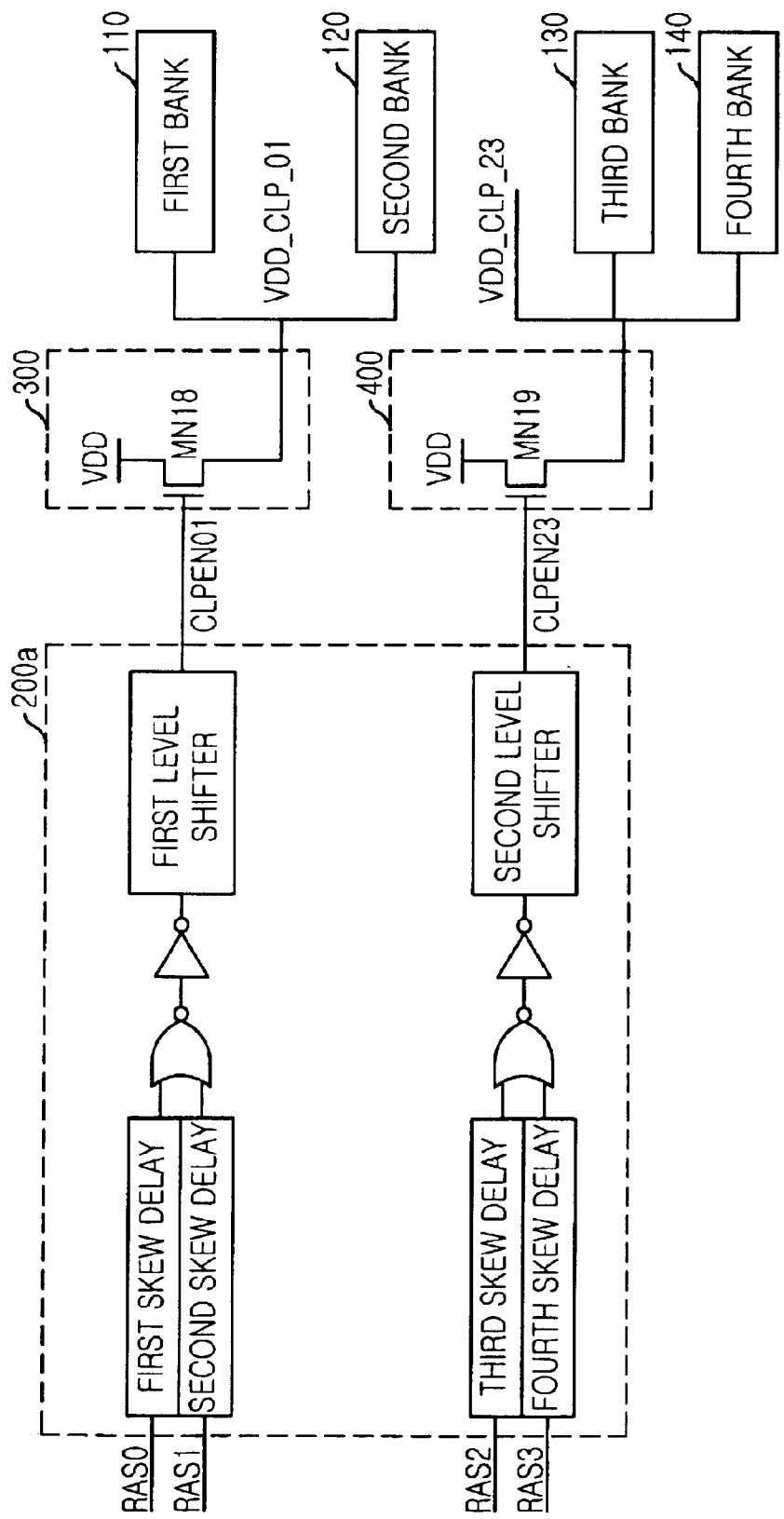
FIG. 9 is a block diagram of a memory device in accordance with another embodiment of the present invention.

FIG. 9 is a block diagram of a memory device in accordance with another embodiment of the present invention.

As shown in FIG. 3, the clamping voltage supply units 150 to 180 for supplying the clamping voltages VDD_CLP0 to VDD_CLP3 are provided to correspond to the respective banks. However, the memory device according to another embodiment of the present invention can be provided with a first clamping voltage supply unit 300 for commonly supplying the clamping voltage to first and second banks 110 and 120, and a second clamping voltage supply unit 400 for commonly supplying the clamping voltage to third and fourth banks 130 and 140.

In this case, a clamping voltage control unit 200a receives first and second RAS signals RAS0 and RAS1 to generate a first clamping control signal CLPEN01 to a first clamping voltage supply unit 300, and receives third and fourth RAS signals RAS2 and RAS3 to generate a second clamping control signal CLPEN23 to a second clamping voltage supply unit 400.

Figure 10:
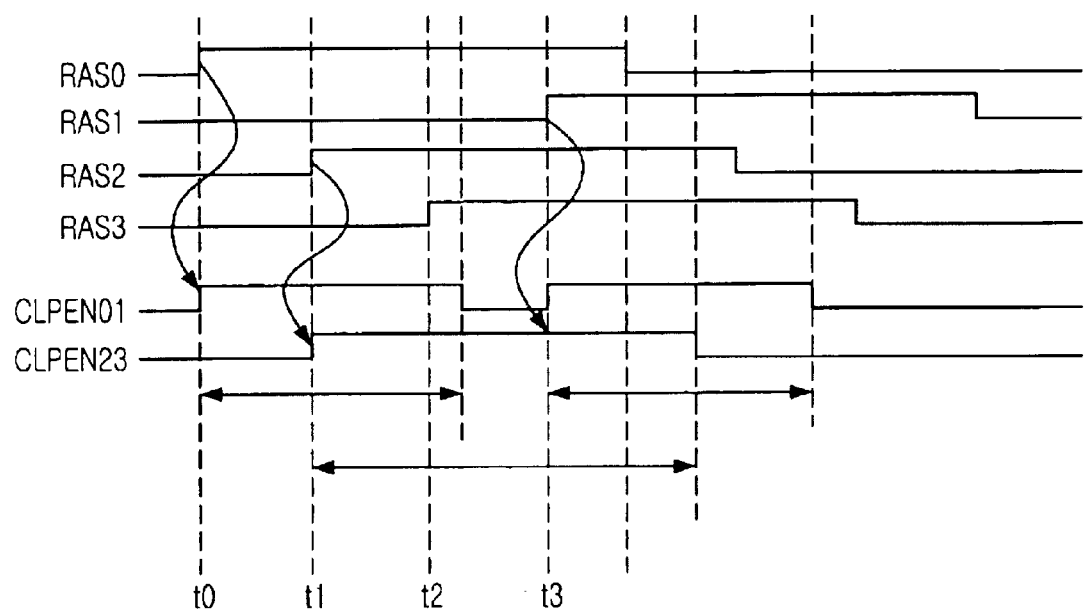
FIG. 10 is a waveform illustrating an operation of a memory device shown in FIG. 9.

FIG. 10 is a waveform illustrating an operation of the memory device shown in FIG. 9.

Waveforms of the first and second clamping control signals CLPEN01 and CLPEN23 generated from the clamping voltage control unit 200a are shown in FIG. 10. Here, periods when the first and second clamping control signals CLPEN01 and CLPEN23 are enabled are determined according to periods when the clamping voltages are used in the respective banks. Additionally, if the memory device is provided with eight banks, every four banks receive the clamping voltages in response to the first and second clamping control signal CLPEN01 and CLPEN23.

According to the present invention, the respective banks individually receive the clamping voltages. Therefore, noise generated in the internal circuits of the banks can be remarkably reduced due to the clamping voltages VDD_CLP0 to VDD_CLP3 that are higher than a level of a core voltage Vcore used as an operating voltage of the bank.

Further, a driving noise in the banks is greatly reduced since the respective banks individually receive the clamping voltages inputted for a specific operating period, thereby improving the reliability of the semiconductor memory device.

While the present invention has been described with respect to the particular embodiments, it will be apparent to those skilled in the art that various changes and modifications may be made without departing from the scope of the invention as defined in the following claims.

What is claimed is:

1. A semiconductor memory device comprising:
a plurality of banks;
a plurality of clamping voltage supply means, corresponding to the plurality of banks, for supplying clamping voltages to the corresponding banks wherein a value of the clamping voltages is equal to subtracting a threshold voltage from the level of a corresponding champing control signal; and
a clamping voltage control means for outputting the clamping control signals at a Vpp level to allow the corresponding clamping voltages to be supplied to selected banks while the selected banks are activated, wherein the Vpp level is higher than the value of a core voltage used as an operating voltage of the banks.

2. The semiconductor memory device as recited in claim 1, wherein the clamping voltage supply means is provided with a MOS transistor having one terminal receiving the power supply voltage, a gate receiving the clamping control signal from the clamping voltage control means, and the other terminal supplying the clamping voltage to the corresponding bank.

3. The semiconductor memory device as recited in claim 1, wherein the clamping voltage control means includes:

a plurality of delay units for delaying a plurality of bank enable signals for a predetermined time and outputting the delayed bank enable signals, the plurality of bank enable signals being enabled during a period when the plurality of banks are activated; and a plurality of level shifters corresponding to the plurality of delay units, for shifting a level of the power supply voltage to a level of the clamping control signal and supplying the shifted signal to the plurality of clamping voltage supply means, and for receiving outputs of the plurality of delay units to interrupt the clamping control signals.

4. The semiconductor memory device as recited in claim 3, wherein the level shifter includes:

a first MOS transistor having one terminal connected to a voltage supply terminal having a level of the clamping control signal, the other terminal connected to a first node, and a gate connected to a second node;

a second MOS transistor having one terminal connected to the voltage supply terminal, the other terminal connected to the second node, and a gate connected to the first node;

a third MOS transistor having a gate receiving the power supply voltage, one terminal connected to the first node, and the other terminal connected to an output terminal of the corresponding delay unit among the plurality of delay units; and a fourth MOS transistor having a gate connected to the output terminal of the first delay, one terminal connected to the second node, and the other terminal connected to the ground voltage, the clamping control signal being outputted through the second node.

5. The semiconductor memory device as recited in claim 4, wherein the delay unit includes:

a first inverter for inverting the bank enable signal;

a delay element for delaying an output of the first inverter for a predetermined time;

a NAND gate for receiving the bank enable signal and an output of the delay element; and a second inverter for inverting an output of the NAND gate to output the inverted signal to the gate of the fourth MOS transistor of the corresponding level shifter.

* * * * *